United States Patent
Rajan et al.

(10) Patent No.: US 8,080,937 B2
(45) Date of Patent: Dec. 20, 2011

(54) OLED HAVING A CHARGE TRANSPORT ENHANCEMENT LAYER

(75) Inventors: Kamala Rajan, Newtown, PA (US); Ken Urbanik, Ewing, NJ (US); Ruiqing Ma, Morristown, NJ (US); Brian D'Andrade, Westhampton, NJ (US)

(73) Assignee: Universal Display Corporation, Ewing, NJ (US)

( * ) Notice: Subject to any disclaimer, the term of this patent is extended or adjusted under 35 U.S.C. 154(b) by 702 days.

(21) Appl. No.: 11/938,651

(22) Filed: Nov. 12, 2007

(65) Prior Publication Data

US 2009/0121619 A1  May 14, 2009

(51) Int. Cl.
*H01L 51/10* (2006.01)
(52) U.S. Cl. ........................................ 313/506; 313/504
(58) Field of Classification Search .................. 313/504, 313/506; 428/690; 257/40
See application file for complete search history.

(56) References Cited

U.S. PATENT DOCUMENTS

| | | | |
|---|---|---|---|
| 5,776,622 A | 7/1998 | Hung et al. | |
| 5,776,623 A | 7/1998 | Hung et al. | |
| 7,061,175 B2 | 6/2006 | Weaver et al. | |
| 7,071,615 B2 | 7/2006 | Lu et al. | |
| 2004/0256983 A1* | 12/2004 | Hung et al. | 313/506 |
| 2007/0020483 A1* | 1/2007 | Park et al. | 428/690 |
| 2007/0181887 A1* | 8/2007 | Kijima et al. | 257/79 |
| 2010/0012926 A1* | 1/2010 | Lee et al. | 257/40 |

FOREIGN PATENT DOCUMENTS

WO  WO 2005076753 A2 *  8/2005

OTHER PUBLICATIONS

B.J. Chen et al., "Enhanced performance of tris-(8-hydroxyquinoline) aluminum-based organic light-emitting devices with LiF/Mg:Ag/Ag cathode," Optics Express, v. 13, No. 1, p. 26-31, Jan. 10, 2005.
Chieh-Wei Chen et al., "An effective cathode structure for inverted top-emitting organic light-emitting devices," Appl. Phys. Lett., 85, 13, p. 2469-71, Sep. 27, 2004.
Li Chuan-Nan, "Enhanced Brightness and Efficiency in Organic Light-Emitting Devices Using an LiF-Doped Electron-injecting Layer with Aluminium Cathode," Chin. Phys. Lett. 18, 1, p. 120-22, 2001.
Y. Yuan et al., "Interaction between organic semiconductors and LiF dopant," Appl. Phys. Lett. 85, 21, p. 4959-61, Nov. 22, 2004.

* cited by examiner

*Primary Examiner* — Karabi Guharay
(74) *Attorney, Agent, or Firm* — Kenyon & Kenyon LLP (57) ABSTRACT

Charge transport enhancement layers and structures are provided that may improve the performance of organic devices, specifically organic light emitting devices. A charge transport enhancement layer may include a layer or an inorganic material, metal oxide, halide, and/or alkali disposed between two organic layers, and separated from the cathode by an intervening organic layer. One or more CTELs may be used, such as in an alternating stack of organic and CTEL layers. Surprisingly, it has been found that the use of one or more CTELs arranged in a stack with intervening organic layers may improve the performance of the device even where the layer is not directly adjacent to the cathode.

24 Claims, 12 Drawing Sheets

OLED HAVING A CHARGE TRANSPORT ENHANCEMENT LAYER

FIELD OF THE INVENTION

The present invention relates to organic light emitting devices. More specifically, it relates to organic light emitting devices having one or more charge transport enhancement layers.

JOINT RESEARCH AGREEMENT

The claimed invention was made by, on behalf of, and/or in connection with one or more of the following parties to a joint university corporation research agreement: Princeton University, The University of Southern California, the University of Michigan, and Universal Display Corporation. This agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may include a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

Charge transport enhancement layers and structures are provided that may improve the performance of organic devices, specifically organic light emitting devices. A charge transport enhancement layer may include a layer of an inorganic material, metal oxide, halide, and/or alkali disposed between two organic layers, and separated from the cathode by an intervening organic layer. One or more CTELs may be used, such as in an alternating stack of organic and CTEL layers. Surprisingly, it has been found that the use of one or more CTELs arranged in a stack with intervening organic layers may improve the performance of the device even where the layer is not directly adjacent to the cathode.

DETAILED DESCRIPTION

Generally, an OLED includes at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Figure 1:
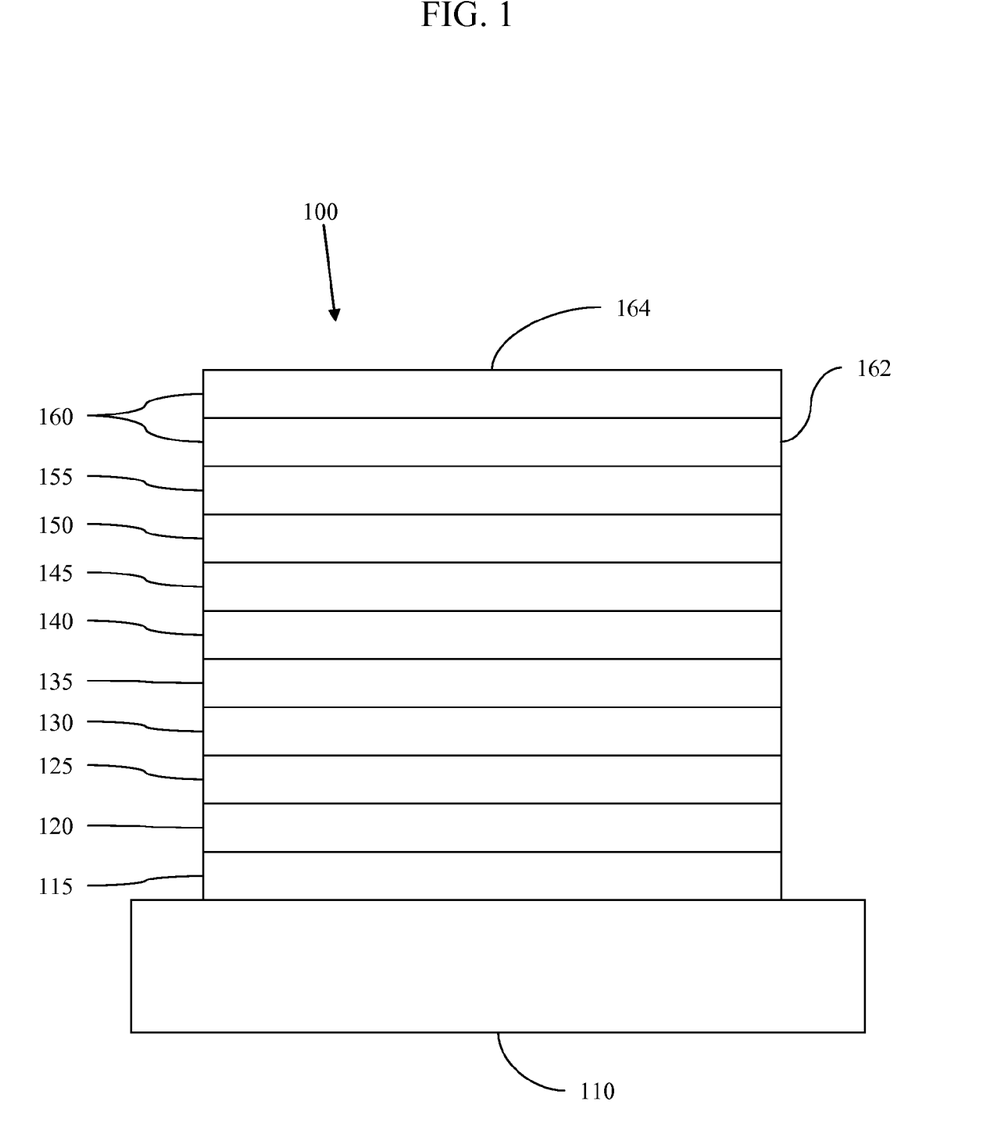
FIG. 1 shows an organic light emitting device having separate electron transport, hole transport, and emissive layers, as well as other layers.

FIG. 1 shows an exemplary organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also include a host material capable of transporting electrons and/or holes, doped with an emissive material that may trap electrons, holes, and/or excitons, such that excitons relax from the emissive material via a photoemissive mechanism. Emissive layer 135 may include a single material that combines transport and emissive properties. Whether the emissive material is a dopant or a major constituent, emissive layer 135 may include other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers include a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may unclude a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
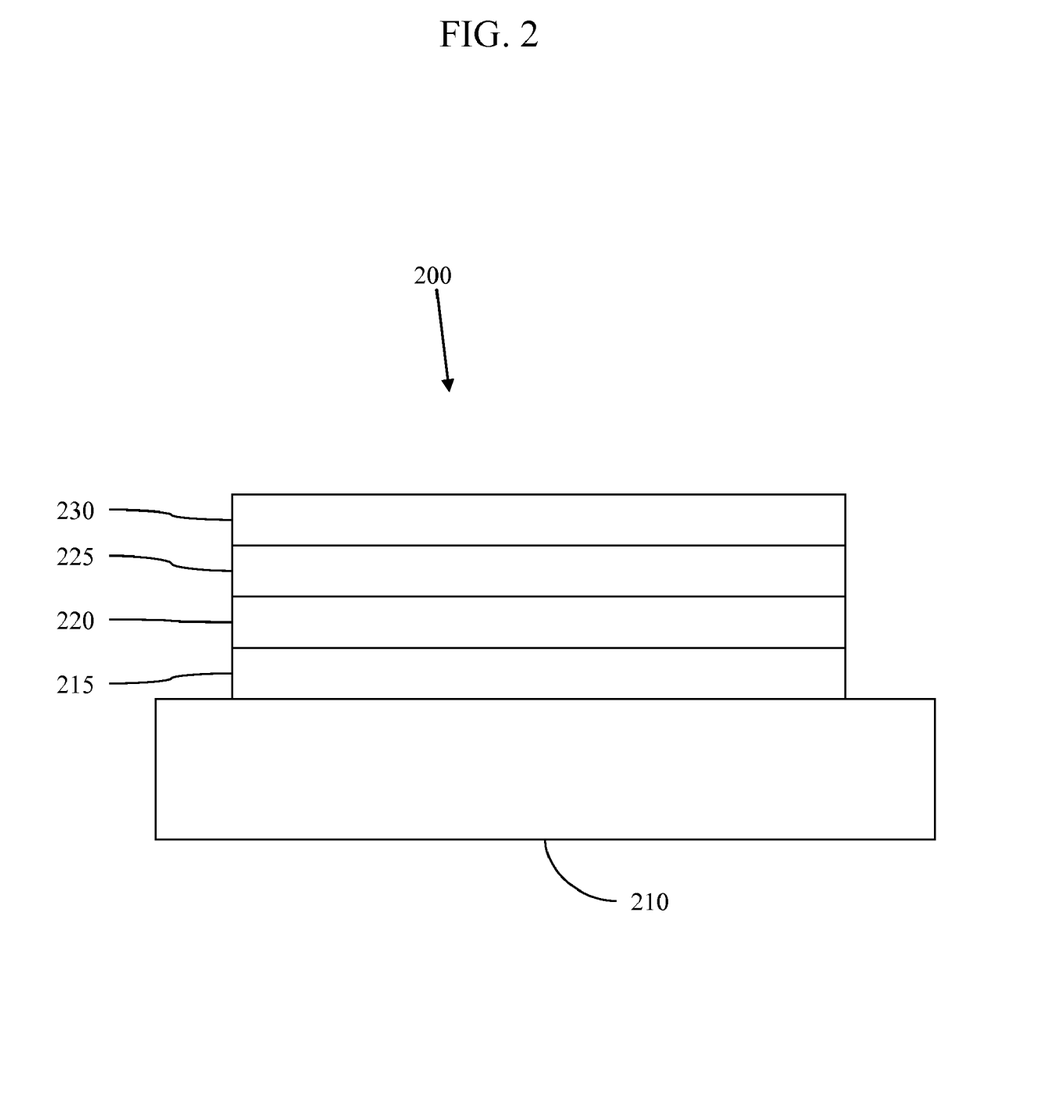
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1-2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may include a single layer, and may further include multiple layers of different organic materials as described, for example, with respect to FIGS. 1-2.

Structures and materials not specifically described may also be used, including polymeric materials such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1-2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method.

Devices fabricated in accordance with the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Conventional OLEDs typically have a structure such as anode/hole injection layer (HIL)/hole transport layer (HTL)/emissive layer (EML)/hole blocking layer (HBL)/electron transport layer (ETL)/cathode. Other layers may be included or omitted as previously described. Common cathode structures include a metal with an oxide layer, a fluoride layer with metal and/or oxide layers, and a fluoride layer with metal, organic, and/or oxide layers. The fluoride layer commonly is placed immediately adjacent to and in direct physical contact with the metal cathode layer to promote electron injection. It is believed that during fabrication of the device, deposition of the cathode on a fluoride layer causes the fluoride layer to become damaged and/or damage the underlying organic layer, "forcing" some fluoride into the organic layer. It is further believed that this effect improves electron injection from the cathode into the organic layer.

In contrast, devices according to the present invention include a CTEL such as a fluoride layer that is separated from the cathode by an intervening organic layer. One or more CTELs may be used, such as in an alternating stack of organic and CTEL layers. Conventional analysis would suggest that multiple layers of, for example, fluoride, metal, oxide, and/or alkali compounds arranged within the device would decrease the lifetime and/or performance of the OLED. Surprisingly, it has been found that the use of one or more CTELs arranged in a stack with intervening organic layers may improve electron injection/transport even where an organic layer is directly adjacent to the cathode.

It has been found that the voltage, efficiency and/or lifetime of an OLED may be improved by incorporating one or more charge transport enhancement layers (CTEL) in an organic layer close to the cathode, but separated from the cathode by an intervening organic layer. Although not intending to be bound by any particular theory, it is believed that including one or more CTELs separated from the cathode/organic interface may improve electron injection from the cathode and/or electron transfer through the organic materials of the device.

Figure 3A:
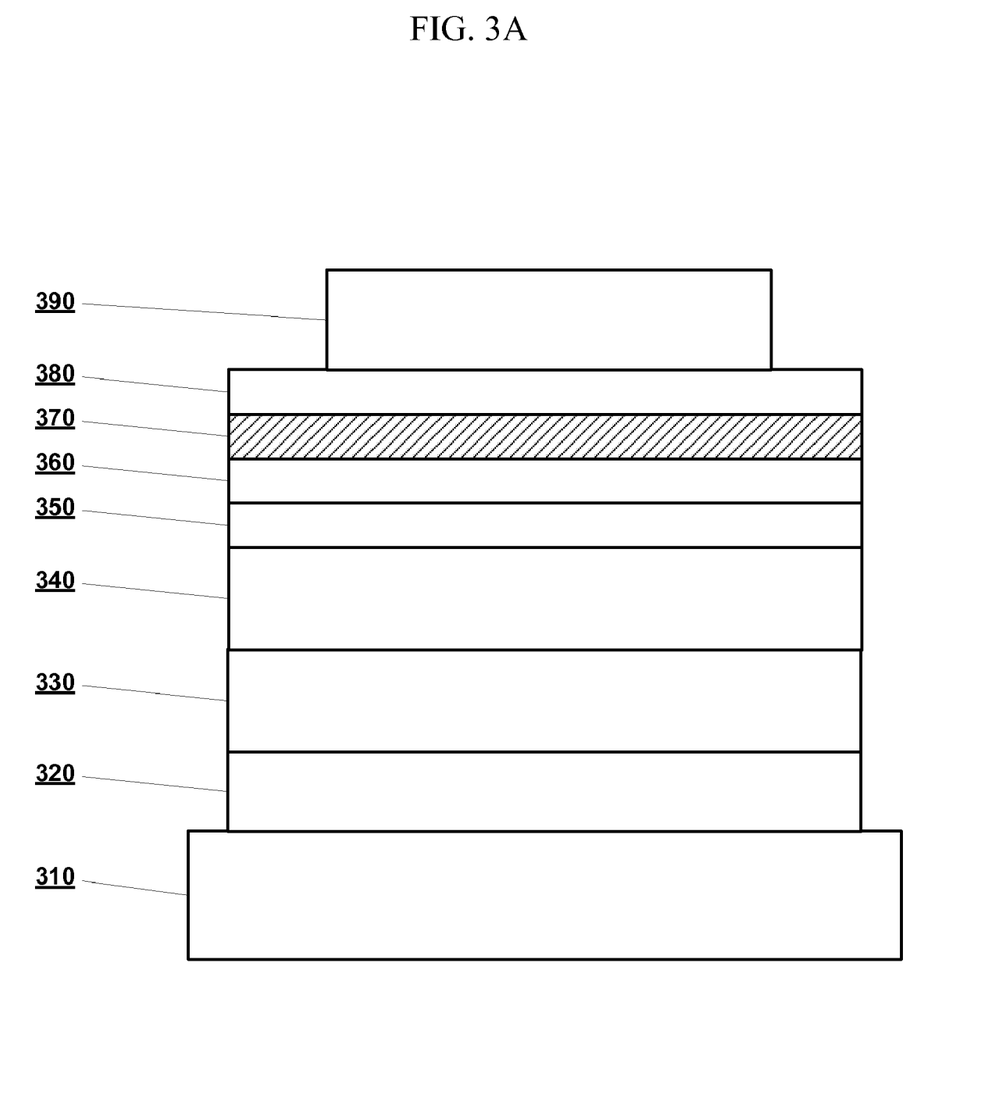
FIG. 3A shows an OLED having a charge transport enhancement layer.

FIG. 3A shows an exemplary device according to the present invention. The device may include an anode 310, hole injection layer 320, hole transport layer 330, emissive layer 340, hole blocking layer 350, electron transport layer 360, and a cathode 390 as previously described. The device further includes a CTEL 370 separated from the cathode by an organic layer 380. The CTEL may include inorganic materials. Specific exemplary CTEL materials include metal oxides, halides, and alkalis, with LiF being a preferred CTEL material. The separating organic layer 380 may include a material suitable for use as an electron transport layer. It may be preferred for the separating organic layer 380 to have the same composition or include the same materials as the electron transport layer 360. In general, different layers than those specifically described herein may be included or omitted from devices according to the invention. However, it may be preferred for a CTEL to be adjacent to and in direct physical contact with intervening organic layers. For example, the CTEL 370 is in direct physical contact with the intervening organic layer 380 and the electron transport layer 360.

Figure 3B:
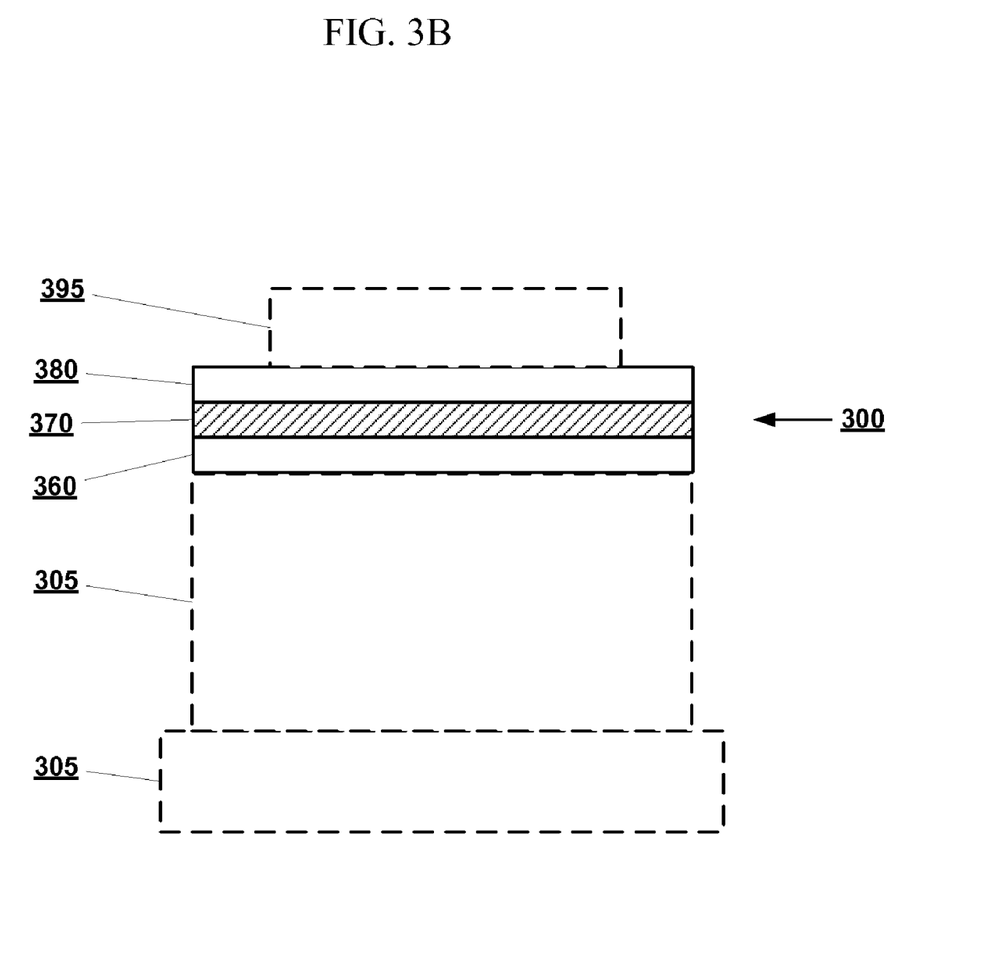
FIG. 3B shows a layer for an OLED that includes a charge transport enhancement layer.

More generally, FIG. 3B shows a layered structure 300 for an organic device that includes a CTEL structure. The device may include a first electrode 305, a second electrode 395, and an organic region 305 disposed between the electrodes. As previously described, the organic region 305 may include various layers, such as emissive layers, transport layers, blocking layers, and injection layers. A CTEL structure may include a CTEL 370 disposed between intervening organic layers 360, 380. An intervening organic layer 380 closest to the second electrode separates the CTEL from the electrode 395. The intervening organic layer 360 may be a separate layer or it may be one of the layers disposed within the organic region 305. As described in further detail below, the layer 300 may include multiple CTELs and intervening organic layers. Typically, the layer 300 may include alternating layers of CTEL and organic material, where each CTEL has at least one organic layer between the CTEL and the electrode 395.

Figure 4:
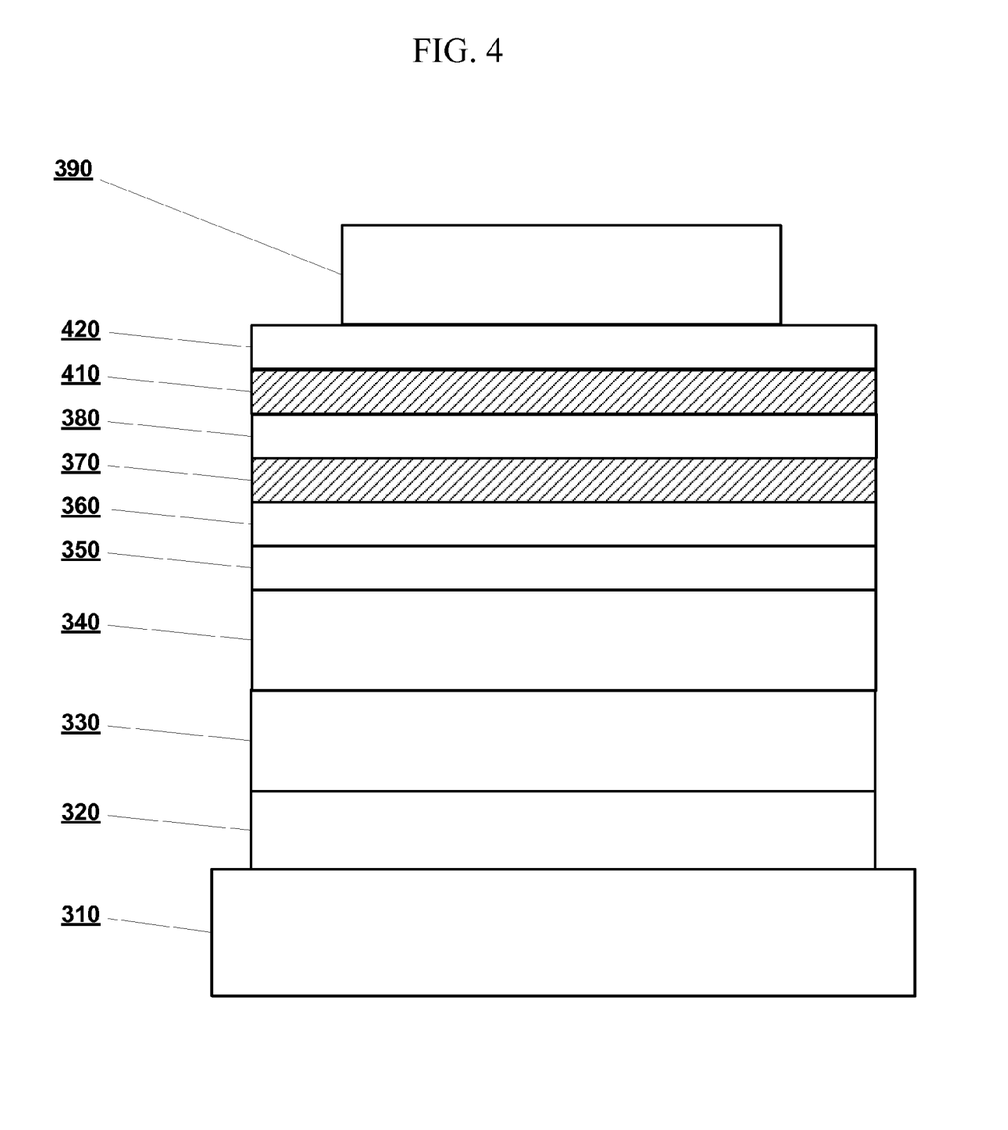
FIG. 4 shows an OLED having multiple charge transport enhancement layers in a stacked configuration.
Figure 5A:
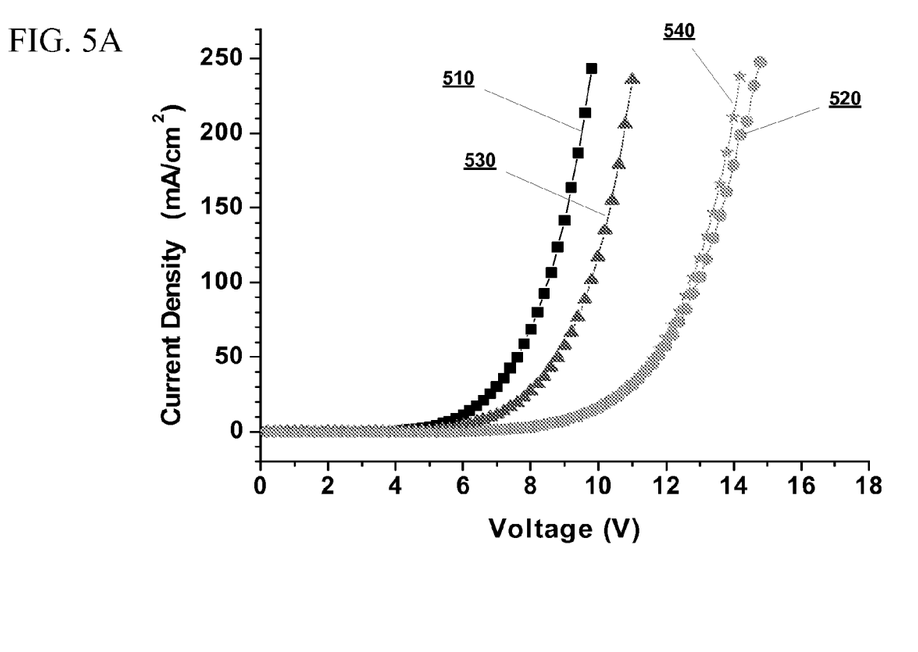
FIG. 5A shows a plot of the current density vs. voltage for several OLEDs, including devices having a charge transport enhancement layer separated from the cathode.
Figure 5B:
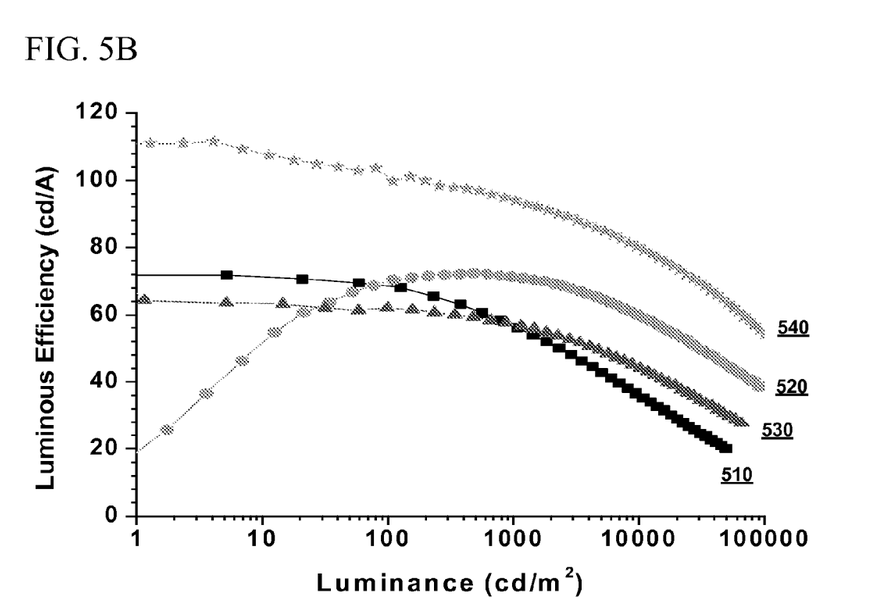
FIG. 5B shows a plot of luminous efficiency vs. luminance for several OLEDs, including devices having a charge transport enhancement layer separated from the cathode.
Figure 5C:
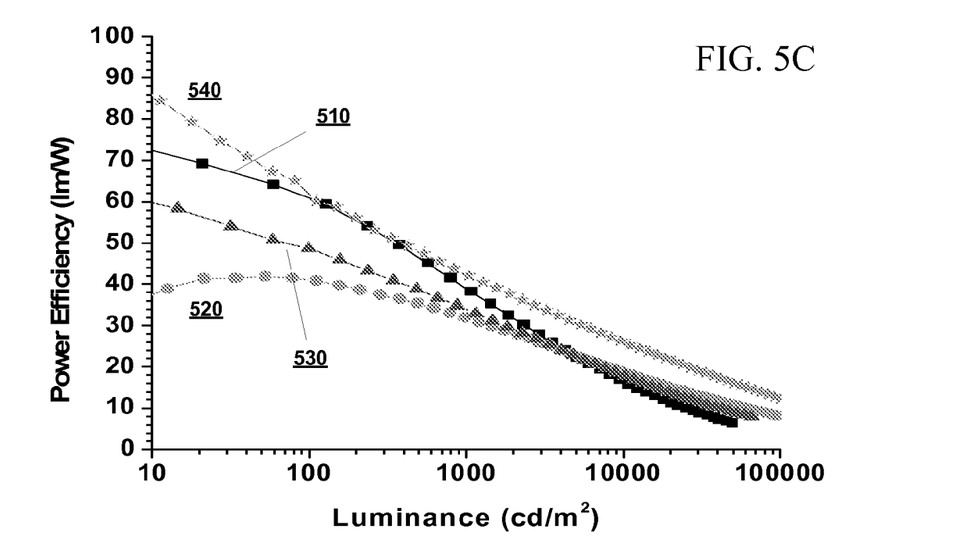
FIG. 5C shows a plot of power efficiency vs. luminance for several OLEDs, including devices having a charge transport enhancement layer separated from the cathode.
Figure 5D:
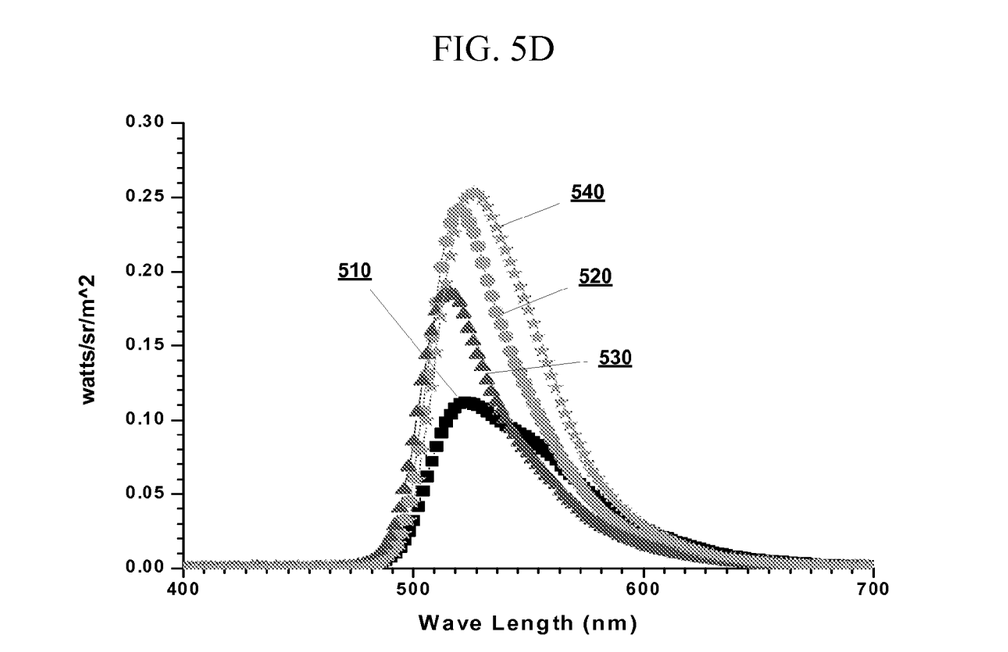
FIG. 5D shows a plot of radiance vs. wavelength for several OLEDs, including devices having a charge transport enhancement layer separated from the cathode.

FIG. 4 shows another exemplary device according to the invention. In addition to the layers described with respect to FIG. 3A, the device includes a second CTEL 410 separated from the first CTEL 370 by an intervening organic layer 380. A separating organic layer 420 is disposed between the cathode 390 and the second CTEL 410. A set of layers such as layers 370, 380, 410, and 420 may be referred to as a "super lattice." The combination of layers also may be referred to as a stacked enhancement layer or other layer. It has been found that including multiple enhancement layers 370, 410 may improve the lifetime, efficiency, and saturation of the device. Each of the CTELs 370, 410 may include metal oxides, halides, and alkalis, and LiF may be a preferred material for each CTEL. Typically the organic layers 380, 420 may include or be a material suitable for transporting electrons. It may be preferred for the CTELs 370, 410 to use the same materials, and/or for the intervening organic layers 380, 420 to use the same materials. Each type of layer may include multiple materials, including host/dopant combinations. Each type of layer also be fabricated from a single material. For example, a preferred structure may include CTELs of LiF, and intervening organic layers of $Alq_3$. Other combinations may be used. CTELs may be fabricated at various thicknesses, with each CTEL preferably being about 0.25 nm to 2.0 nm thick, more preferably 0.5 to 1.0 nm thick. Intervening organic layers such as organic layers 380, 420 in FIGS. 3-4, may be any appropriate dimension, but preferably not more than about 10 nm thick. Where a CTEL is adjacent to another organic layer such as the transport layer 360, the adjacent organic layer may have any appropriate dimension.

Additional CTELs and intervening organic layers may be included in a device according to the invention. That is, a super lattice may include more than two CTELs, with consecutive CTELs being separated by intervening organic layers. Each of the intervening organic layers in a super lattice structure may be the same material or materials as the other layers, or it may include one or more materials that are different from materials in the other layers. Typically each of the CTELs and organic layers will be constructed according to the dimensions, materials, and arrangements described herein.

CTELs and related structures as described herein may be suitable for use with any organic light emitting device, including top-emitting OLEDs, bottom-emitting OLEDs, and transparent OLEDs. Thus, the structures may be used with transparent, opaque, and/or semi-opaque electrodes, including transparent cathodes as previously described.

The devices described herein may be fabricated by depositing the described layers in order. For example, the device illustrated in FIG. 3A may be fabricated by obtaining a substrate 310, and depositing the layers 320, 330, 340, 350, 360, 370, 380, 390 on and over the substrate using suitable deposition techniques as described herein. It will be understood that a device also may be fabricated using a reverse process, such as where a cathode 390 is deposited on a substrate and the layers are deposited in the order 390, 380, ... 320, and an anode deposited on the completed stack.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:
CBP 4,4'-N,N-dicarbazole-biphenyl
m-MTDATA 4,4',4"-tris(3-methylphenylphenlyamino)triphenylamine
$Alq_3$ 8-tris-hydroxyquinoline aluminum
Bphen 4,7-diphenyl-1,10-phenanthroline
n-Bphen n-doped BPhen (doped with lithium)
$F_4$-TCNQ tetrafluoro-tetracyano-quinodimethane
p-MTDATA p-doped m-MTDATA (doped with $F_4$-TCNQ)
$Ir(ppy)_3$ tris(2-phenylpyridine)-iridium
$Ir(ppz)_3$ tris(1-phenylpyrazoloto,N,C(2')iridium(III)
BCP 2,9-dimethyl-4,7-diphenyl-1,10-phenanthroline
TAZ 3-phenyl-4-(1'-naphthyl)-5-phenyl-1,2,4-triazole
CuPc copper phthalocyanine
ITO indium tin oxide
NPD N,N'-diphenyl-N—N'-di(1-naphthyl)-benzidine
TPD N,N'-diphenyl-N—N'-di(3-toly)-benzidine
BAlq aluminum(III)bis(2-methyl-8-hydroxyquinolinato)4-phenylphenolate
mCP 1,3-N,N-dicarbazole-benzene
DCM 4-(dicyanoethylene)-6-(4-dimethylaminostyryl-2-methyl)-4H-pyran
DMOA N,N'-dimethylquinacridone
PEDOT:PSS an aqueous dispersion of poly(3,4-ethylenedioxythiophene) with polystyrenesulfonate (PSS)
hfac hexafluoroacetylacetonate
1,5-COD 1,5-cyclooctadiene
VTES vinyltriethylsilane
BTMSA bis(trimethylsilyl)acetylene
$Ru(acac)_3$ tris(acetylacetonato)ruthenium(III)
$C_{60}$ Carbon 60 ("Buckminsterfullerene")
LG185 available from LG Chem., Ltd., 104-380, Munjidong, Yusueng-gu, Daejon, 305-380, Republic of Korea
$Ir(3-Meppy)_3$: HPT:

EXPERIMENTAL

Specific representative embodiments of the invention will now be described, including how such embodiments may be made. It is understood that the specific methods, materials, conditions, process parameters, apparatus and the like do not necessarily limit the scope of the invention.

Several devices were fabricated with the following structure: Ag anode/HIL/HTL/EML/HBL/enhancement structure/cathode. Various enhancement structures were tested to determine the effects of one or more CTELs. Although referred to as an "enhancement structure," the tested structures may not result in any specific improvement to lifetime, efficiency, and/or saturation. Devices were fabricated using no enhancement layer, i.e., a standard bottom-emitting OLED (BEOLED), a single layer of $Alq_3$, a CTEL structure using $Alq_3$/LiF/LG185, and a CTEL super lattice using $Alq_3$ and LiF. An anode including 20 nm of Ti and 100 nm of Ag was deposited on a cleaned 6"×6" piece of glass to form the anode. Photolithography was used to pattern the anode, with each anode pad having a 2 $mm^2$ grid opening for the device active area. The organic layers and cathode were deposited using a VTE process, and a top transparent cathode layer was sputtered onto the top-most metal cathode layer. The coupons were encapsulated with glass-to-glass encapsulation and tested, giving the following results. Each device is identified by a reference numeral 510, 520, 530, 540 used to identify data acquired from the device in FIGS. 5A-5D. These plots show, respectively, the current density vs. voltage, luminous efficiency vs. luminance, power efficiency vs. luminance, and radiance vs. wavelength for the devices. Although the tested devices were primarily green devices, similar results are expected for OLEDs having other emission spectra.

| Device | Enhancement Structure | Luminance (nits) | CIE |
|---|---|---|---|
| 510 | None (standard BEOLED) | 4408 | (0.329, 0.624) |
| 520 | $Alq_3$ | 6553 | (0.255, 0.668) |
| 530 | $Alq_3$/LiF/LG185 | 4785 | (0.248, 0.668) |
| 540 | $Alq_3$/LiF/$Alq_3$/LiF/$Alq_3$ | 8120 | (0.288, 0.667) |

The IVL data measured for these devices at 1000 nits is presented below:

| Device | Voltage (V) | Current (mA) | Lum. Efficiency (cd/A) | Pow. Efficiency (lm/W) | EQE (%) |
|---|---|---|---|---|---|
| 510 | 4.6 | 1.8 | 56 | 39 | 15 |
| 520 | 7.0 | 1.4 | 71 | 32 | 19 |
| 530 | 5.3 | 1.8 | 57 | 34 | 16 |
| 540 | 7.0 | 1.1 | 94 | 42 | 24 |

Surprisingly, the device with multiple LiF layers (i.e., multiple CTELs) was found to have the highest efficiency at 94 cd/A, 7V and 42 lm/W at 1000 nits. This is noticeably higher than the standard BEOLED at 56 cd/A, 4.6 V and 39 lm/W. Further, the spectral luminance of 8120 nits at 10 $mA/cm^2$ is nearly double the luminance of the BEOLED (4408 nits). The CIE coordinates also indicate that the devices having one or more CTELs are much more saturated than the standard BEOLED.

Figure 6:
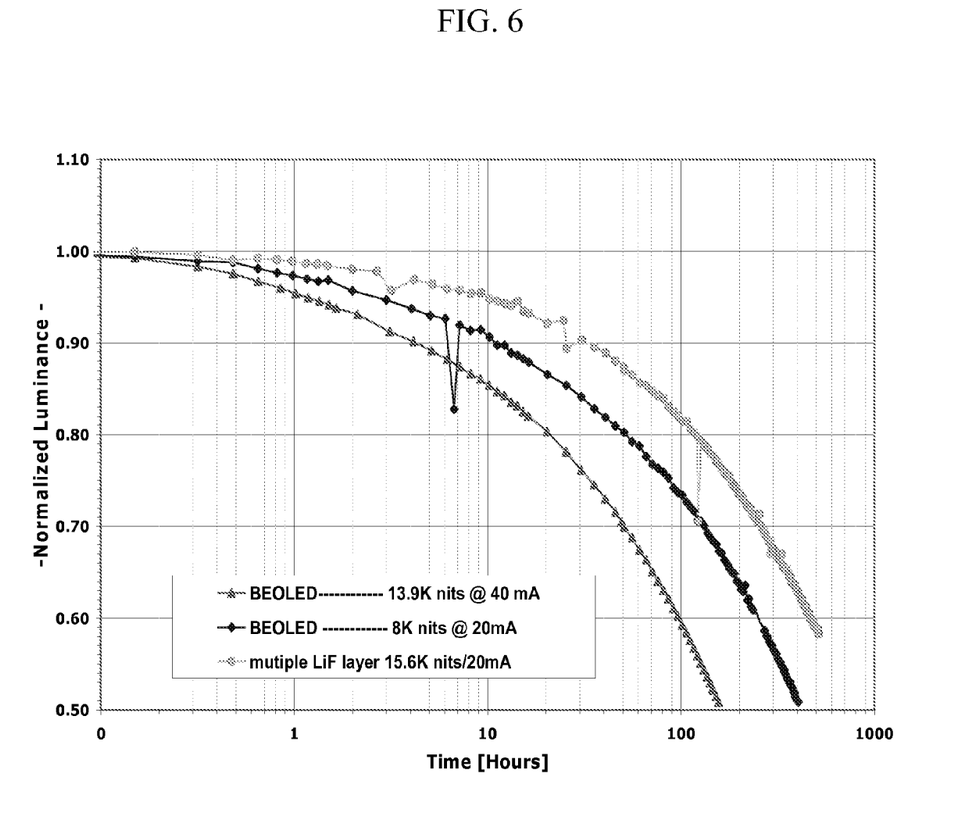
FIG. 6 shows a plot of luminance vs. lifetime for several OLEDs, including devices having a charge transport enhancement layer separated from the cathode.
Figure 7A:
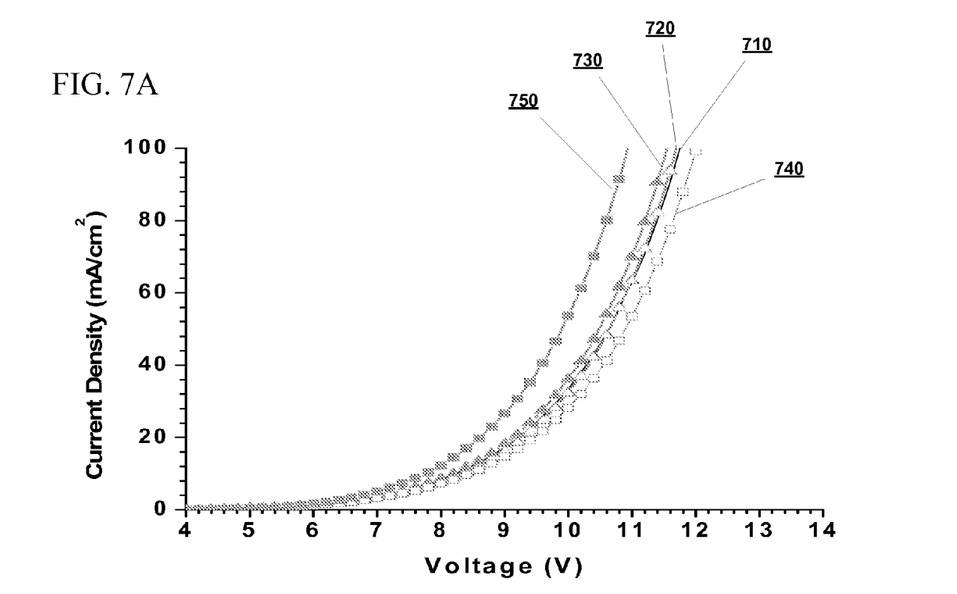
FIG. 7A shows a plot of current density vs. voltage for several OLEDs, including devices having a charge transport enhancement layer separated from the cathode.
Figure 7B:
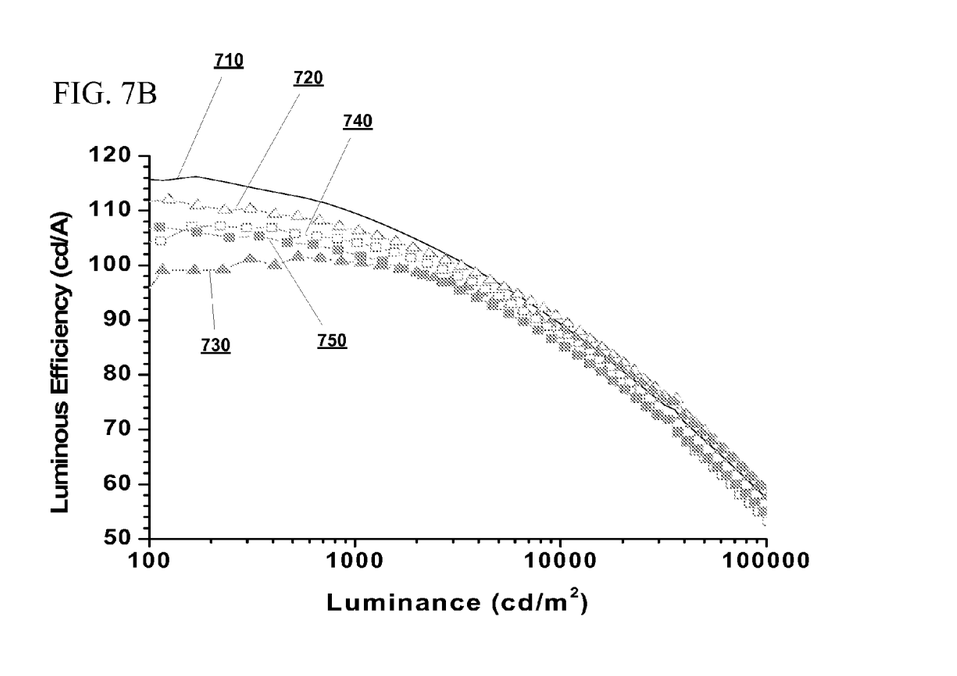
FIG. 7B shows a plot of luminous efficiency vs. luminance for several OLEDs, including devices having a charge transport enhancement layer separated from the cathode.
Figure 7C:
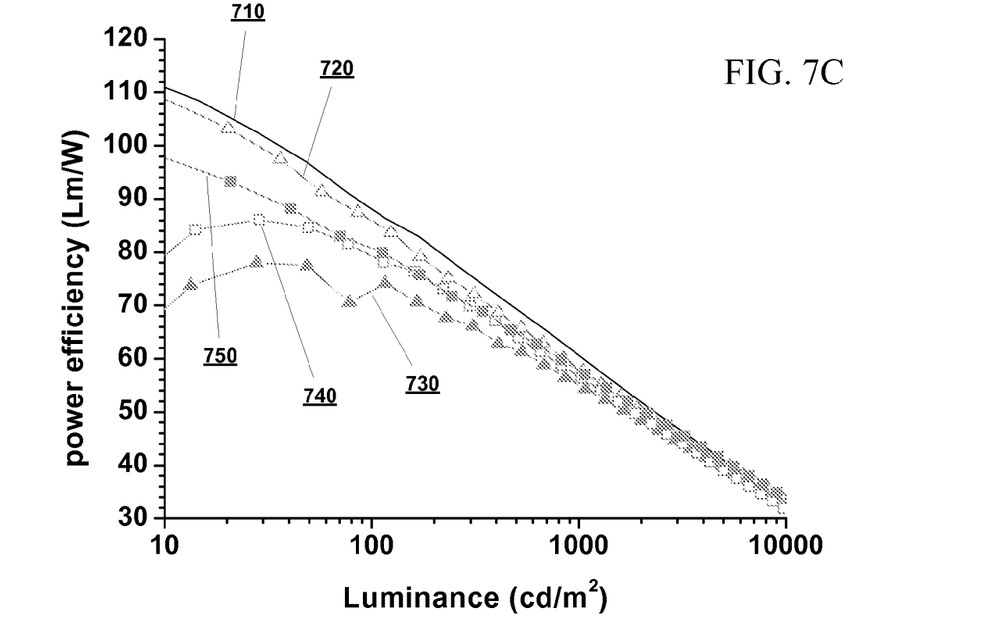
FIG. 7C shows a plot of power efficiency vs. luminance for several OLEDs, including devices having a charge transport enhancement layer separated from the cathode.
Figure 7D:
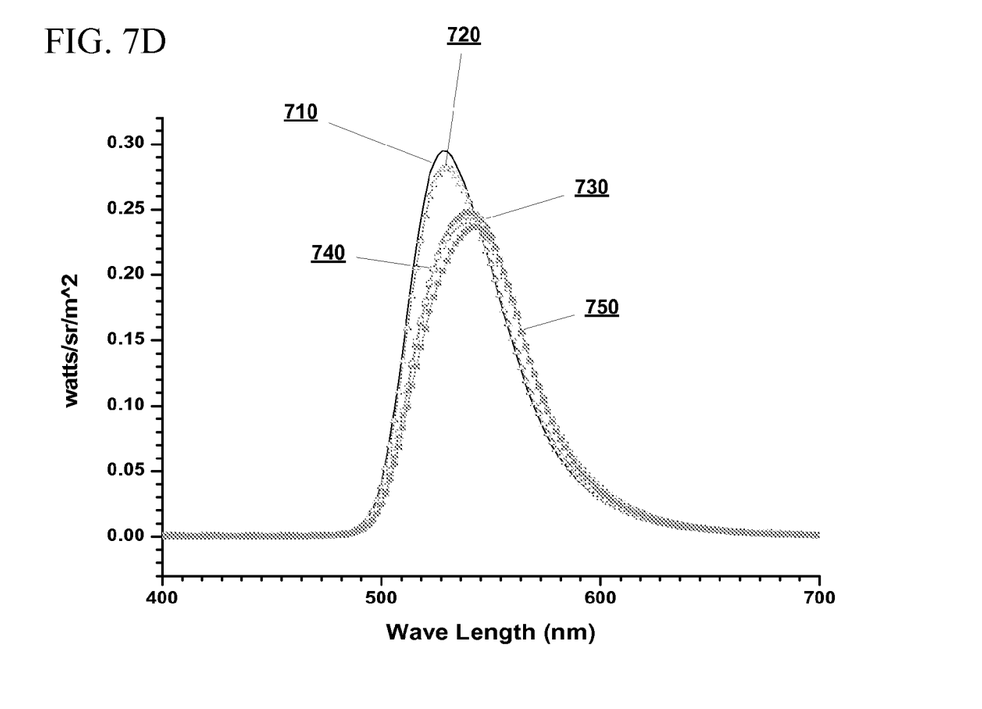
FIG. 7D shows a plot of radiance vs. wavelength for several OLEDs, including devices having a charge transport enhancement layer separated from the cathode.

The high-efficiency device having multiple CTELs was also life tested against a standard BEOLED device at nearly the same luminance at the same charging current. In both cases the CTEL device lifetime was much higher than the conventional devices, as shown by the luminance/lifetime curves in FIG. 6.

Devices were also fabricated with structures of anode/HIL/NPD/CBP:$Ir(3-Meppy)_3$/HPT/enhancement structure/cathode. Although the term "enhancement structure" is used to reference a stacked structure disposed adjacent to the cathode, the tested structures may not result in any specific improvement to lifetime, efficiency, and/or saturation. Each device is identified below by a reference numeral 710, 720, 730, 740, 750 used to identify data acquired from the device in FIGS. 7A-7D.

| Device | Enhancement Structure | FWHM (FIG. 7D) | CIE |
|---|---|---|---|
| 710 | $Alq_3$/LiF/$Alq_3$/LiF/$Alq_3$ | 49 nm | (0.285, 0.673) |
| 720 | $Alq_3$/1 nm LiF | 51 nm | (0.292, 0.669) |
| 730 | $Alq_3$/0.5 nm LiF | 57 nm | (0.320, 0.649) |
| 740 | $Alq_3$/1 nm LiF/$Alq_3$ | 58 nm | (0.324, 0.647) |
| 750 | $Alq_3$/0.5 nm LiF/$Alq_3$ | 59 nm | (0.326, 0.648) |

Figure 8:
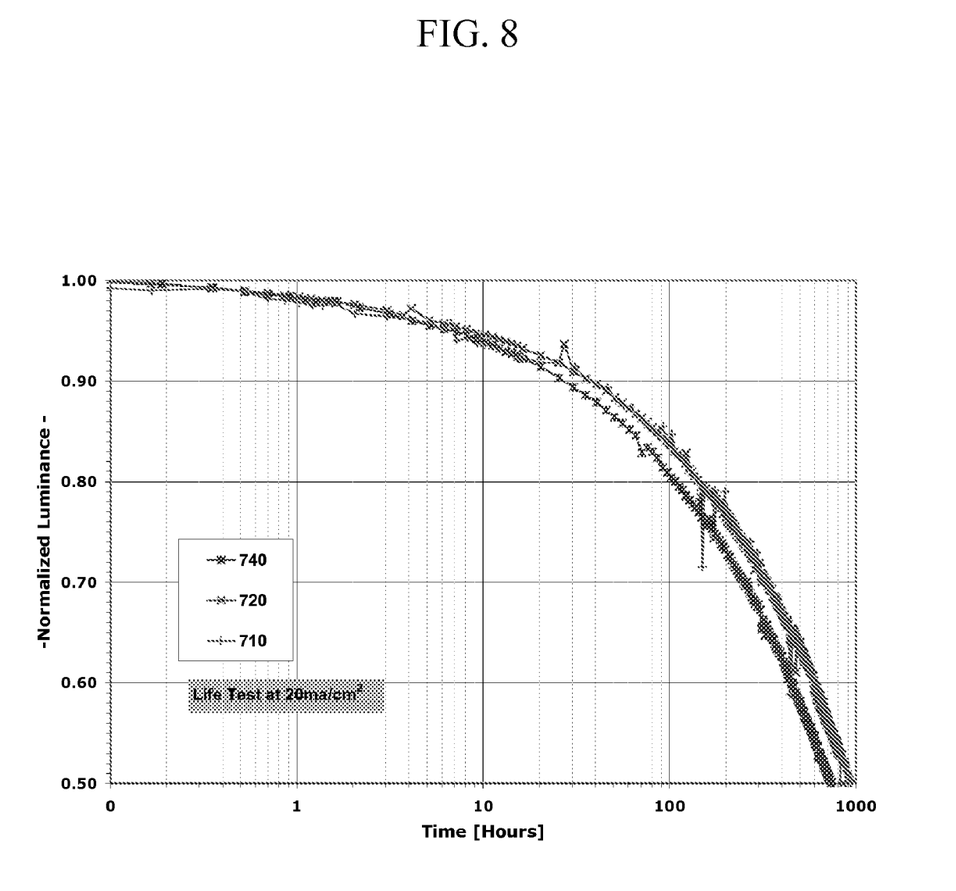
FIG. 8 shows a plot of luminance vs. lifetime for several OLEDs, including devices having a charge transport enhancement layer separated from the cathode.

Surprisingly, it was found that the devices including one or more CTELs exhibited higher efficiency, and that the power efficiency at 1000 nits was nearly the same for all the structures. It was also found that devices having more LiF layers (i.e., a super lattice structure) exhibited larger lifetime increases. The current density vs. voltage, luminous efficiency vs. luminance, power efficiency vs. luminance, and radiance vs. wavelength for the devices are shown in FIGS. 7A-7D, respectively. The lifetimes measured for the various devices are shown in FIG. 8.

Figure 9A:
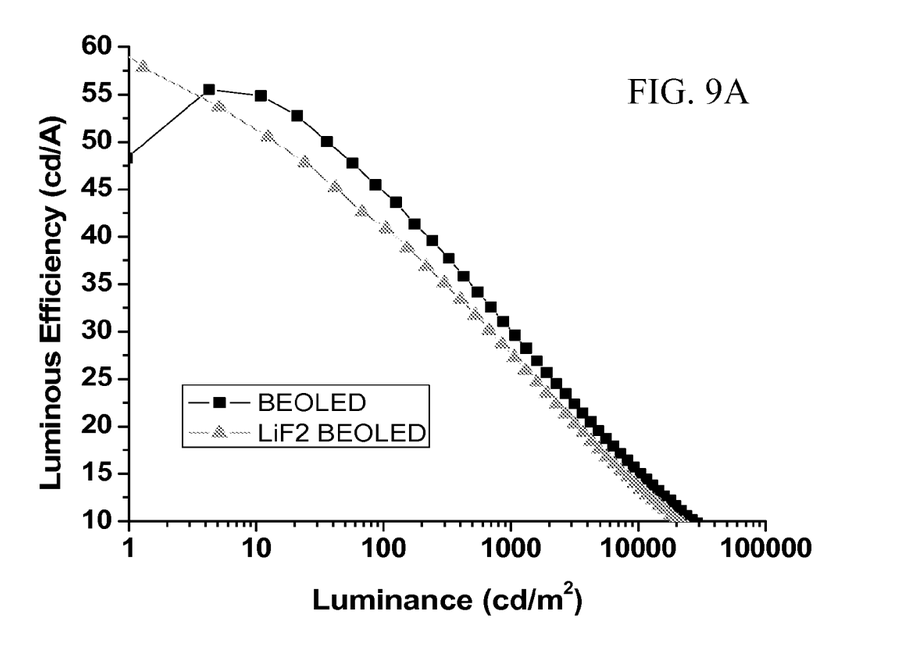
FIG. 9A shows a plot of luminous efficiency vs. luminance for two OLEDs, one of which has a charge transport enhancement layer separated from the cathode.
Figure 9B:
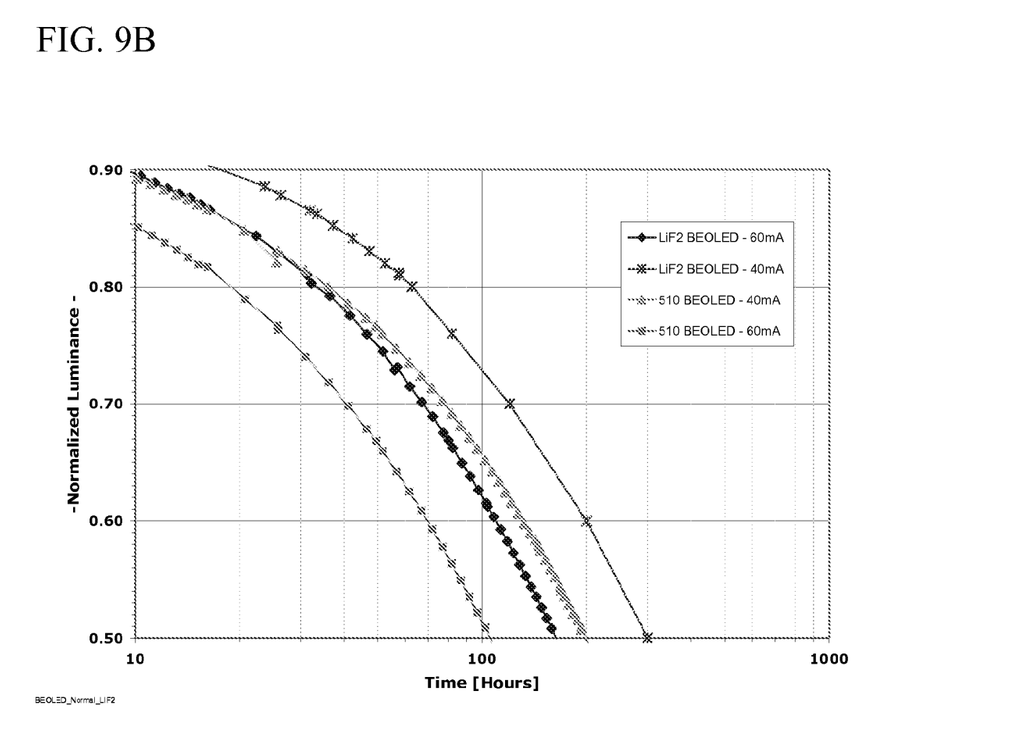
FIG. 9B shows a plot of luminance vs. lifetime for several OLEDs, including devices having a charge transport enhancement layer separated from the cathode.

Bottom-emitting devices were also fabricated with structures of ITO/HIL/NPD/CBP:Ir(3-Meppy)$_3$/HPT/$Alq_3$/LiF/Al cathode (BEOLED) and ITO/HIL/NPD/CBP: Ir(3-Meppy)$_3$/HPT/$Alq_3$/LiF/$Alq_3$/$Alq_3$/MgAg/Ag (LiF2 BEOLED). As shown by FIGS. 9A-9B, it was found that the efficiencies of the two devices were nearly the same but, surprisingly, the lifetime of the LiF2 device (i.e., the device having multiple CTELs) was almost twice the lifetime of the standard BEOLED (FIG. 9B).

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising:
   an anode;
   a cathode;
   an organic emissive layer disposed between the anode and the cathode;
   a first organic layer disposed between the cathode and the organic emissive layer;
   a first charge transport enhancement layer consisting of a first inorganic material directly adjacent the first organic layer between the first organic layer and the cathode;
   a second charge transport enhancement layer consisting of a second inorganic material directly adjacent the first organic layer between the first organic layer and the emissive layer;
   a second organic layer directly adjacent the first charge transport enhancement layer and between the first charge transport enhancement layer and the cathode; and
   a third organic layer directly adjacent the second charge transport enhancement layer between the second charge transport enhancement layer and the emissive layer.

2. The device of claim 1, wherein the first organic layer and the second organic layer contain the same material.

3. The device of claim 1, wherein the first organic layer, the second organic layer, and the third organic layer contain the same material.

4. The device of claim 1, wherein the first charge transport enhancement layer and the second charge transport enhancement layer contain the same material.

5. The device of claim 1, wherein the first organic layer is an electron transport layer.

6. The device of claim 1, wherein each of the first organic layer and the second organic layer is an electron transport layer.

7. The device of claim 1, wherein the cathode is a transparent cathode.

8. The device of claim 1, wherein the charge transport enhancement layer is about 0.25 nm-2.0 nm thick.

9. The device of claim 1, wherein the device is a transparent OLED.

10. The device of claim 1, wherein the first organic layer is not more than about 10 nm thick.

11. The device of claim 1, wherein the first inorganic material is LiF.

12. The device of claim 1, wherein the first inorganic material is an alkali, a halide, or a metal oxide.

13. The device of claim 12, wherein the first organic layer is not more than 10 nm thick.

14. The device of claim 13, wherein the charge transport enhancement layer is about 0.25 nm-2.0 nm thick.

15. The device of claim 14, wherein the second organic layer is directly adjacent the cathode.

16. The device of claim 12, wherein the second inorganic material is the same as the first inorganic material.

17. The device of claim 1, wherein the second organic layer is directly adjacent the cathode.

18. A method of fabricating an organic light emitting device, comprising:
   obtaining an anode;
   depositing an organic emissive layer over the anode;
   depositing a first organic layer over the organic emissive layer;
   depositing a first charge transport enhancement layer consisting of a first inorganic material directly on the first organic layer;
   depositing a second organic layer directly on the first charge transport enhancement layer;
   depositing a second charge transport enhancement layer consisting of a second inorganic material directly on the second organic layer;
   depositing a third organic layer directly on the second charge transport enhancement layer; and
   depositing a cathode over the third organic layer.

19. The method of claim 18, wherein the first organic layer, the second organic layer, and the third organic layer contain the same material.

20. The method of claim 18, wherein the first organic layer and the second organic layer contain the same material.

21. The method of claim 18, wherein the first charge transport enhancement layer and the second charge transport enhancement layer contain the same material.

22. The method of claim 18, wherein the charge transport enhancement layer is about 0.25 nm-2.0 nm thick.

23. The method of claim 18, wherein the first inorganic material is an alkali, a halide, or a metal oxide.

24. The method of claim 23, wherein the second inorganic material is the same as the first inorganic material.

* * * * *